(12) United States Patent
Hiraga et al.

(10) Patent No.: US 10,727,283 B2
(45) Date of Patent: Jul. 28, 2020

(54) DISPLAY DEVICE

(71) Applicant: Japan Display Inc., Tokyo (JP)

(72) Inventors: Kenta Hiraga, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/215,756

(22) Filed: Dec. 11, 2018

(65) Prior Publication Data

US 2019/0115396 A1  Apr. 18, 2019

Related U.S. Application Data

(63) Continuation of application No. 15/681,642, filed on Aug. 21, 2017, now Pat. No. 10,186,558.

(30) Foreign Application Priority Data

Aug. 30, 2016  (JP) .................................. 2016-167854

(51) Int. Cl.
*H01L 27/32* (2006.01)
*H01L 27/12* (2006.01)
(Continued)

(52) U.S. Cl.
CPC .......... *H01L 27/323* (2013.01); *H01L 27/124* (2013.01); *H01L 51/524* (2013.01);
(Continued)

(58) Field of Classification Search
CPC ... H01L 27/323; H01L 51/524; H01L 27/124; H01L 51/5256; H01L 51/0002;
(Continued)

(56) References Cited

U.S. PATENT DOCUMENTS 10,170,727 B2   1/2019  Sato et al.
2010/0295759 A1  11/2010  Tanaka
(Continued)

FOREIGN PATENT DOCUMENTS

JP  2010-272270 A  12/2010
JP  2015-050245 A  3/2015
(Continued)

OTHER PUBLICATIONS

Korean Office Action dated Aug. 13, 2018 for the corresponding Korean Patent Application No. 10-2017-0091889 with partial English translation.

*Primary Examiner* — Su C Kim
(74) *Attorney, Agent, or Firm* — Michael Best & Friedrich LLP

(57) ABSTRACT

A display device in an embodiment according to the present invention includes a substrate, a plurality of wirings above the insulation surface, an interlayer insulation layer covering the plurality of wirings, a light emitting element above the interlayer insulation layer, a first inorganic insulation layer covering the light emitting element, a first detection electrode extending in a first direction above the first inorganic insulation layer, an organic insulation layer above the first inorganic insulation layer covering the first detection electrode, a second detection electrode extending in a second direction intersecting the first direction above the organic insulation layer, a second inorganic insulation layer above the organic insulation layer covering the second detection electrode, a first connection wiring electrically connecting the first detection electrode and one of the plurality of wirings, and a second connection wiring electrically connecting the second detection electrode and another one of the plurality of wirings.

7 Claims, 9 Drawing Sheets

(51) Int. Cl.
    *H01L 51/52*       (2006.01)
    *H01L 51/00*       (2006.01)
(52) U.S. Cl.
    CPC ...... *H01L 27/1203* (2013.01); *H01L 51/0002* (2013.01); *H01L 51/5256* (2013.01)
(58) Field of Classification Search
    CPC ............. H01L 27/1203; H01L 51/5237; H01L 51/5203; H01L 27/3276; H01L 27/3258; H01L 27/3246; G06F 2203/04102; G06F 3/044; G06F 3/0412
    See application file for complete search history.

(56) References Cited

U.S. PATENT DOCUMENTS

| | | | |
|---|---|---|---|
| 2014/0117316 A1* | 5/2014 | Choi | H01L 51/5253 257/40 |
| 2014/0145979 A1 | 5/2014 | Lee | |
| 2015/0060817 A1 | 3/2015 | Sato et al. | |
| 2016/0154499 A1* | 6/2016 | Bae | G06F 3/044 345/174 |
| 2016/0299610 A1 | 10/2016 | Yoon | |

FOREIGN PATENT DOCUMENTS

| | | |
|---|---|---|
| KR | 10-2014-0118955 A | 10/2014 |
| KR | 10-2016-0065396 A | 6/2016 |
| KR | 10-2016-0097170 A | 8/2016 |

\* cited by examiner

DISPLAY DEVICE

CROSS-REFERENCE TO RELATED APPLICATIONS

This application is a continuation of U.S. patent application Ser. No. 15/681,642 filed on Aug. 21, 2017. Further, this application claims priority from Japanese patent application JP 2016-167854 filed on Aug. 30, 2016, the entire contents of which are hereby incorporated by reference into this application.

FIELD

The present invention is related to a display device. One embodiment of the invention disclosed in the present specification is related to a wiring structure of a touch sensor arranged in a display device.

BACKGROUND

Electronic devices which are operated by touching an image such as an icon displayed on a screen are becoming widespread. Display devices which are used in such electronic devices are also called touch panels (or touch screens). An electrostatic capacitance type touch sensor is employed in a touch panel. An element which detects a change in electrostatic capacitance between a pair of sensor electrodes called a Tx electrode and Rx electrode as an input signal is included in an electrostatic capacitance type touch sensor.

A conventional touch panel includes a structure in which a touch sensor panel and display panel overlap each other. However, a structure in which two panels overlap each other increases the thickness of a display device which is a problem. For example, in a display device which curves or bends known as a flexible display, a structure in which a touch sensor panel and display panel overlap each other is the cause of obstruction to flexibility.

Therefore, a structure in which the function of a touch sensor is incorporated within a display panel is disclosed. For example, an in-cell type display device is disclosed in which a first detection electrode and a second detection electrode are arranged sandwiching an inorganic insulation film arranged as a sealing film in a display panel which uses an organic electroluminescence element (called an "organic EL element" herein), and a touch sensor is arranged within the panel (for example, refer to Japanese Laid Open Patent Publication No: 2015-050245).

When attempting to install a touch sensor in a display panel, wiring for a connection with detection electrodes is required which increases the number of wiring layers. Since it is necessary to protect a display element using a sealing layer in a display panel, it is necessary to arrange a connection structure without degrading the sealing capability of a sealing layer when connecting wiring with a detection electrode or when connecting wiring connected to a detection electrode with a terminal electrode.

SUMMARY

A display device in an embodiment according to the present invention includes a substrate having an insulation surface, a plurality of wirings above the insulation surface, an interlayer insulation layer covering the plurality of wirings, a light emitting element above the interlayer insulation layer, a first inorganic insulation layer covering the light emitting element, a first detection electrode extending in a first direction above the first inorganic insulation layer, an organic insulation layer above the first inorganic insulation layer covering the first detection electrode, a second detection electrode extending in a second direction intersecting the first direction above the organic insulation layer, a second inorganic insulation layer above the organic insulation layer covering the second detection electrode, a first connection wiring electrically connecting the first detection electrode and one of the plurality of wirings, and a second connection wiring electrically connecting the second detection electrode and another one of the plurality of wirings.

A display device in an embodiment according to the present invention includes a plurality of wirings above a substrate having an insulation surface, an interlayer insulation layer covering the plurality of wirings, a pixel region arranged with a plurality of pixels including a light emitting element above the substrate having the insulation surface, a sealing layer over the interlayer insulation layer and covering the pixel region, a first detection electrode extending in a first direction and a second detection electrode extending in a second direction intersecting the first direction above the pixel region, a first connection wiring electrically connecting the first detection electrode and one of the plurality of wirings, and a second connection wiring electrically connecting the second detection electrode and another wire included in the plurality of wirings. The sealing layer includes an organic insulation layer, a first inorganic insulation layer arranged on a lower layer side of the organic insulation layer, and a second inorganic insulation layer arranged on an upper layer side of the organic insulation layer, and one of the first detection electrode and the second detection electrode is arranged on an upper layer side of the organic insulation layer and the other is arranged on a lower layer side of the organic insulation layer, both being arranged sandwiching the organic insulation layer.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a cross-sectional view, the side on which the second substrate is located with respect to the substrate will be described as "above" and the other side will be described as "below."

Figure 1:
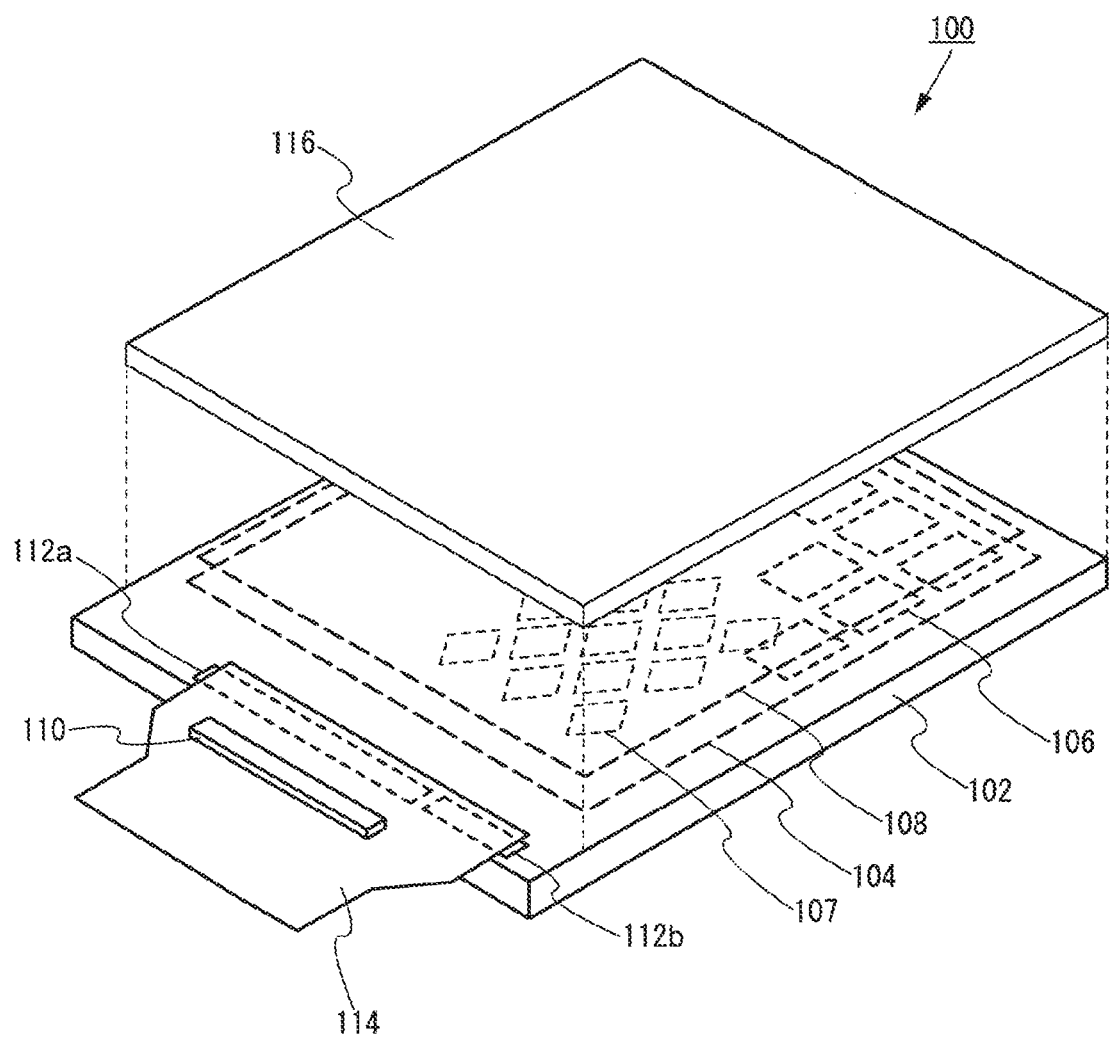
FIG. 1 is a perspective view diagram showing a structure of a display device related to one embodiment of the present invention.

FIG. 1 is a perspective view diagram showing a structure of a display device 100 related to one embodiment of the present invention. The display device 100 is arranged with a pixel region 104 and a touch sensor 108 on one main surface of a substrate 102 having an insulation surface. The pixel region 104 is arranged with a plurality of pixels 106. The plurality of pixels 106 is arranged in a row direction and column direction for example in the pixel region 104. The touch sensor 108 is arranged overlapping the pixel region 104. In other words, the touch sensor 108 is arranged so as to overlap the plurality of pixels 106. The touch sensor 108 is arranged with a plurality of detection electrodes 107 in a matrix shape and each is connected in a row direction and column direction respectively. Furthermore, a pixel 106 and touch sensor 108 are represented schematically here and their size relationship is not limited to that described in FIG. 1.

The display device 100 includes a first terminal region 112a input with a video signal and the like, and a second terminal region 112b which inputs and outputs signals of the touch sensor 108. The first terminal region 112a and second terminal region 112b are arranged at one end part in one main surface of the substrate 102 having an insulation surface. The first terminal region 112a and second terminal region 112b are arranged with a plurality of terminal electrodes along an end part of the substrate 102 having an insulation surface. The plurality of terminal electrodes of the first terminal region 112a and second terminal region 112b is connected to a flexible printed wiring substrate 114. A drive circuit 110 outputs a video signal to a pixel 106. The drive circuit 110 is attached to the one main surface of the substrate 102 or the flexible printed wiring substrate 114.

The substrate 102 having an insulation surface is formed by a member such as glass or plastic (polycarbonate, polyethylene telephthalate, polyimide and polyacrylate and the like). When the material of the substrate 102 is a plastic, it is possible to provide flexibility to the display device 100 by thinning the substrate. That is, it is possible to provide a flexible display by using a plastic substrate as the substrate 102.

A polarization plate 116 which includes a polarizer may be arranged above the pixel region 104 and touch sensor 108. For example, the polarization plate 116 is formed by a polarizer exhibiting circularly polarized light properties. The polarization plate 116 is formed from a film material including a polarizer. By arranging the polarization plate 116 overlapping the pixel region 104 it is possible to prevent glare (mirror like state) of a display screen.

Furthermore, although omitted in FIG. 1, a pixel 106 is formed including a display element and a circuit element. It is preferred that the touch sensor 108 is an electrostatic capacitance type and is formed by a first detection electrode (Tx wiring) and second detection electrode (Rx wiring). An interlayer insulation layer is arranged between the pixel region 104 and touch sensor 108 so that they do not electrically and mutually short-circuit.

Figure 2:
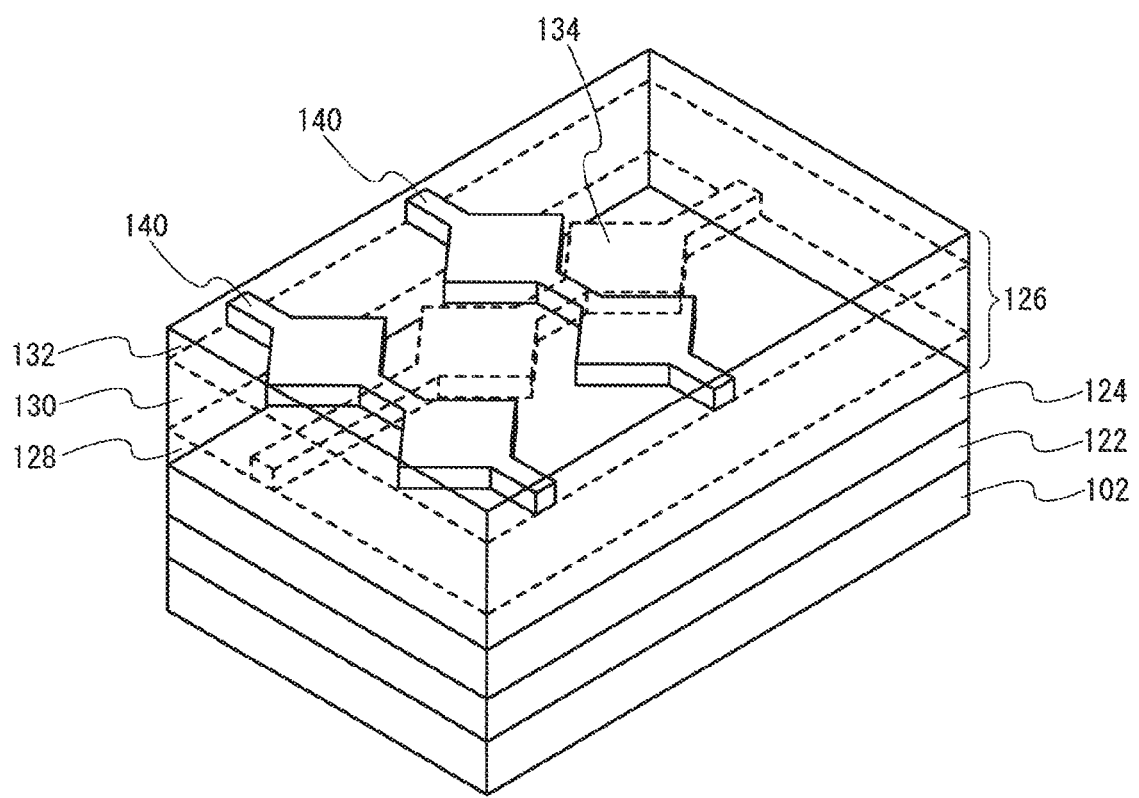
FIG. 2 is a perspective view diagram showing a structure of a pixel region of a display device related to one embodiment of the present invention.

FIG. 2 is a perspective view diagram showing the pixel region 104 and a structure of the touch sensor 108 arranged thereupon. As is shown in FIG. 2, the pixel region 104 includes a circuit element layer 122 arranged with a circuit element and a display element layer 124 arranged with a display element above the substrate 102. A sealing layer 126 including a detection electrode for a touch sensor is arranged above the display element layer 124. The sealing layer 126 is arranged to cover an upper side surface of a display region when the main surface on the viewer side is set as a top surface.

The circuit element layer 122 includes an interlayer insulation layer. The interlayer insulation layer insulates wiring arranged in different layers. The interlayer insulation layer includes at least one inorganic interlayer insulation layer and at least one organic interlayer insulation layer. The inorganic interlayer insulation is formed by an inorganic insulation material such as silicon oxide, silicon nitride, silicon oxynitride and aluminum oxide and the like. The organic interlayer insulation layer is formed by an organic insulation material such as acrylic and polyimide and the like. The circuit element layer 122 includes an active element such as a transistor, a capacitor, a passive element such as a resistor and wiring which links these elements, and these are arranged buried in the interlayer insulation layer.

The display element layer 124 includes a light emitting element or an element which exhibits electro-optical effects by application of a voltage as a display element. In the case where an organic EL element is used as a light emitting element, the display element layer 124 is formed including electrodes distinguished as an anode and cathode, an organic layer including an organic EL material and a partition wall layer having insulation properties which divides adjacent organic EL elements in a planar view. The organic EL element is electrically connected with a transistor of the circuit element layer 122.

The sealing layer 126 includes a structure in which a plurality of insulation films is stacked. FIG. 2 shows a structure in which a first inorganic insulation layer 128, organic insulation layer 130 and second inorganic insulation layer 132 are stacked as the sealing layer 126. The sealing layer 126 has increased sealing capabilities by using a stacked structure combining different materials. For example, even if the first inorganic insulation layer 128 includes defects, the organic insulation layer 130 buries such defective parts and by further arranging the second inorganic insulation layer 132 it is possible to compensate for any degradation in sealing capabilities due to these defects. The second inorganic insulation layer 132 may be arranged so as to cover the entire surface of a pixel region 104 and to cover at least a part of a region on the outer side of a pixel region 104, and the first inorganic insulation layer 128 and second inorganic insulation layer 132 may be formed so as to cover a region further to the outside of the second inorganic insulation layer 132. In addition, the outer circumference end parts of the first inorganic insulation layer 128 and second inorganic insulation layer 132 do not always have to match.

The sealing layer 126 encloses at least one of or both of the first detection electrode 134 and second detection electrode 140 which form the touch sensor 108. The first detection electrode 134 is arranged extending in a first direction and the second detection electrode 140 is arranged extending in a second direction intersecting the first direction. Although it is possible to set the first direction to an arbitrary direction, for example, it is possible to set the first direction along a column direction corresponding to the arrangement of pixels. In this case, it is possible to set the second direction to a direction along an arrangement of pixels in a row direction. A plurality of first detection electrodes 134 and second detection electrodes 140 are arranged respectively. In the present embodiment, a group formed by a plurality of first detection electrodes 134 is called a first detection electrode pattern and a group formed by a plurality of second detection electrodes 140 is called a second detection electrode pattern. Furthermore, only a part of the first detection electrode 134 and second detection electrode 140 is shown in FIG. 2, and a plurality of these detection electrodes are arranged aligned across roughly the entire pixel region 104.

This type of first detection electrode 134 and second detection electrode 140 are arranged sandwiching an organic insulation layer 130 which forms at least the sealing layer 126. The first detection electrode 134 and second detection electrode 140 are insulated by the organic insulation layer 130. That is, the first detection electrode 134 is arranged on one surface side of the organic insulation layer 130 and the second detection electrode 140 is arranged on the other surface side. The first detection electrode 134 and second detection electrode 140 are insulated by being arranged sandwiching the organic insulation layer 130 and electrostatic capacitance is generated between both detection electrodes. The touch sensor 108 determines the presence of a touch by detecting a change in the electrostatic capacitance produced between the first detection electrode 134 and second detection electrode 140.

Figure 3:
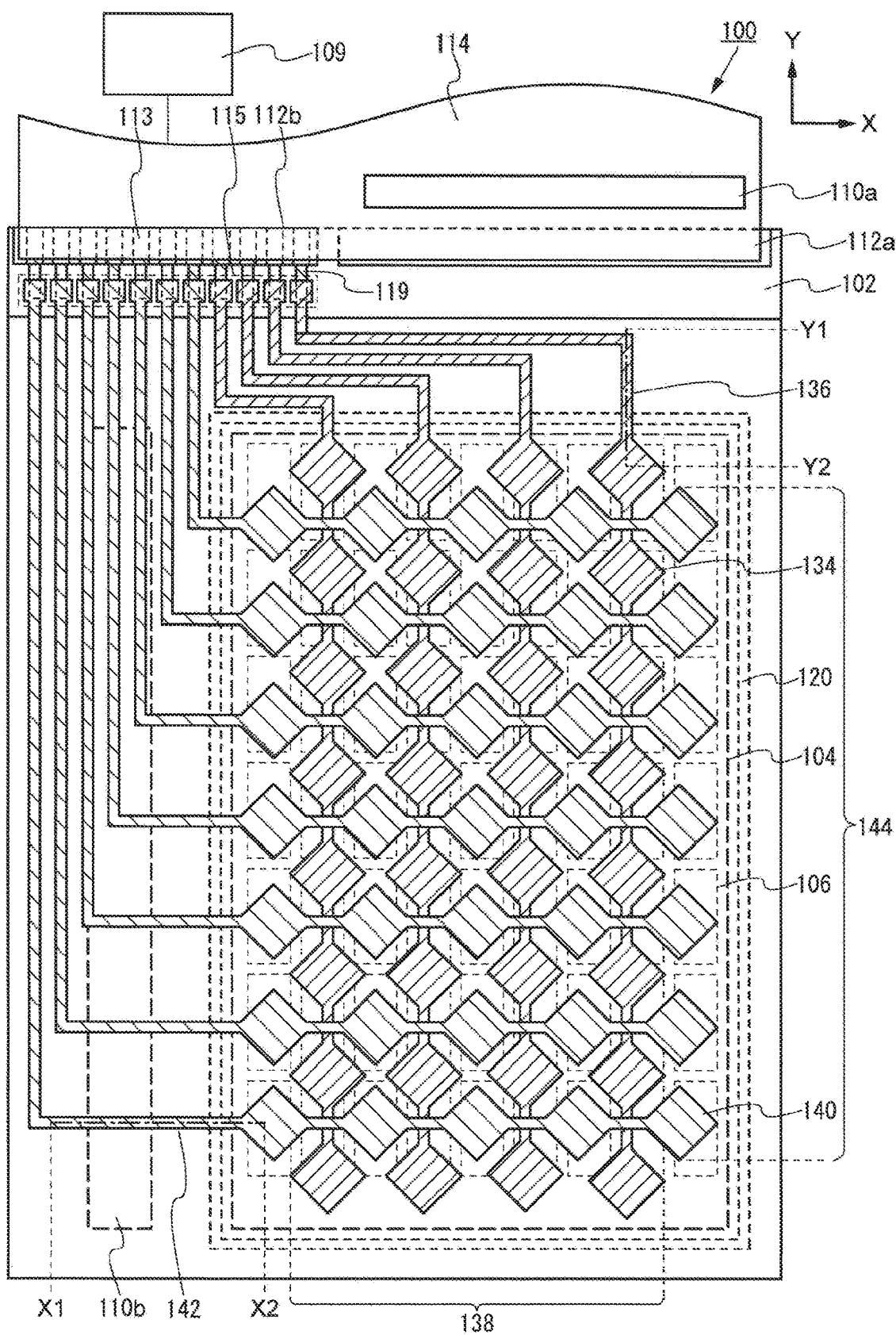
FIG. 3 is a planar diagram showing a structure of a display device related to one embodiment of the present invention.

FIG. 3 shows a planar view diagram of a display device 100. FIG. 3 schematically shows the first detection electrode 134 and second detection electrode 140. FIG. 3 shows a vertical direction as a Y direction and a horizontal direction as an X direction with respect to the page surface for the convenience of explanation.

In FIG. 3, a plurality of first detection electrodes 134 extend in the Y direction and a plurality of second detection electrodes 140 extend in the X direction. Here, a group of a plurality of first detection electrodes 134 is set as a first detection electrode pattern 138 and a group of a plurality of second detection electrodes 140 is set as a second detection electrode pattern 144.

Furthermore, the shape of the first detection electrode 134 and the second detection electrode 140 is arbitrary. The first detection electrode 134 and the second detection electrode 140 may have a rectangular (stripe) shape or may have a diamond shape as is shown in FIG. 3. By adopting a detection electrode having such a stripe shape or diamond shape, an improvement in detection sensitivity of the touch sensor 108 is achieved.

The first detection electrode pattern 138 and the second detection electrode pattern 144 are arranged in a region overlapping the pixel region 104. In other words, the first detection electrode and second detection electrode are arranged to overlap at least a part (part of a light emitting element arranged in a pixel) of a pixel 106. By adopting such an arrangement, it is possible to sense the presence of a touch with the touch sensor 108 while continuing to display an image such as an icon and the like in the display region 104.

The first detection electrode 134 is electrically connected with first connection wiring 136 arranged on the outer side of the pixel region 104. The first connection wiring 136 is electrically connected with wiring 119 arranged corresponding to a terminal electrode of the second terminal region 112*b*. The first connection wiring 136 extends towards an end part where the terminal region 112 of the substrate 102 is arranged and further curves extending to the connection part 115. A plurality of wirings 119 is arranged each corresponding to a terminal electrode 113 arranged in the second terminal region 112*b*. The plurality of wirings 119 extends from a connection part with the first connection wiring 136 towards to the second terminal region 112*b*. That is, the first detection electrode 134 and a terminal electrode of the second terminal region 112*b* are electrically connected by the first connection wiring 136 and wiring 119.

The second detection electrode 140 is electrically connected with the second connected wiring 142 arranged on the outer side of the pixel region 104. The second connection wiring 142 extends from the pixel region 104 towards one side edge of the substrate 102, and further bends and extending to the second terminal region 112*b* along this side edge. In addition, the second connection wiring 142 is arranged corresponding to a terminal electrode of the second terminal region 112*b* and is electrically connected with a plurality of wirings 119 extending from a connection part with the second connection wiring 142 towards the second terminal region 112*b*. That is, the second detection electrode 140 and a terminal electrode of the second terminal region 112*b* are electrically connected by the second connection wiring 142 and wiring 119. The second connection wiring 142 may also be arranged in a region overlapping a region where a drive circuit 110*b* is arranged in the substrate 102. The frame of a display panel can be narrowed by overlapping the second connection wiring 142 with the drive circuit 110*b*.

Furthermore, a plurality of terminal electrodes 113 of the second terminal region 112*b* is arranged along the end part of the substrate 102. The wiring 119 is arranged corresponding to each terminal electrode 113. The wiring 119 extends from the terminal electrode 113 to an inner side region of the substrate 102. The wiring 119 which is connected with a terminal electrode 113 of the second terminal region 112*b* is arranged at least on a lower layer side sandwiching at least one interlayer insulation layer with respect to the first connection wiring 136 and second connection wiring 142. The first connection wiring 136 and second connection wiring 142 are connected at the connection part 115. In the connection part 115, wiring 119 of a lower layer side is electrically connected with the first connection wiring 136 and second connection wiring 142 via a contact hole 186 arranged in an insulation layer in the connection part 115.

An opening region 120 is arranged in the substrate 102 enclosing the pixel region 104. In other words, an interlayer insulation layer above the substrate 102 includes at least one inorganic interlayer insulation layer and organic interlayer insulation layer and includes a stacked layer region in which an inorganic interlayer insulation layer and organic interlayer insulation layer are stacked and an opening region where an organic interlayer insulation layer is removed and an inorganic interlayer insulation layer is remains. The opening region 120 is explained in detail using a cross-sectional structure of the pixel region 104 described herein. The first connection wiring 136 and second connection wiring 142 are extracted from the pixel region 104 to a periphery edge part of the substrate 102 passing above the opening region 120.

The second terminal region 112b is connected with a touch sensor control part 109 via a flexible printed wiring substrate 114. That is, a detection signal obtained from the first detection electrode 134 and second detection electrode 140 is transmitted to the second terminal region 112b via the first connection wiring 136 and second connection wiring 142 and also the wiring 119, and is output to the touch sensor control part 109 via the flexible printed wiring substrate 114.

Figure 4:
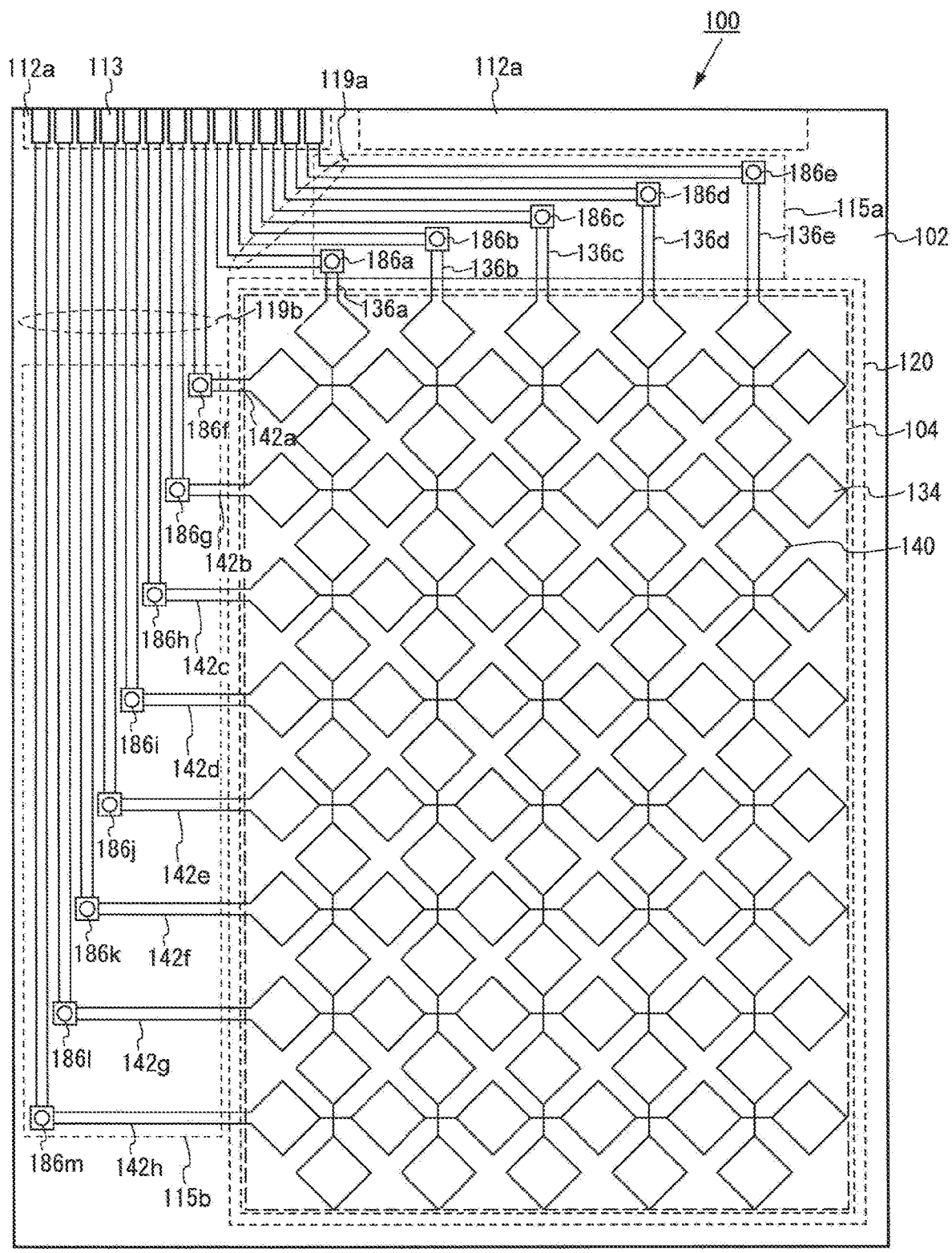
FIG. 4 is a planar diagram showing a structure of a display device related to one embodiment of the present invention.

FIG. 3 shows an example in which a connection part between the first connection wiring 136, second connection wiring 142 and the wiring 119 is arranged in the vicinity of the second terminal region 112b. On the other hand, FIG. 4 shows another form of the connection part 115. First connection wirings 136a~136e extend towards an end part where the terminal region 112 of the substrate 102 is arranged. One end of the plurality of wirings 119 extends as far as the first connection wirings 136a~136e along an end part of the substrate 102 arranged with the terminal region 112. In addition, the plurality of wirings 119a and the first connection wirings 136a~136e are connected to each other through the contact holes 186a~186e at region where the wirings 119a and the first connection wirings 136a~136e intersect each other. The connection part 115a is arranged with the contact holes 186a~186e along a side edge of the substrate 102. Second connection wirings 142a~142e extend toward one side end part of the substrate 102. One part of a plurality of wirings 119 extends as far as the second connection wirings 142a~142e along this one side end part. In addition, the plurality of wirings 119b and the first connection wirings 142a~142e are connected to each other through the contact holes 186f~186m at region where the wirings 119b and the first connection wirings 142a~142e intersect each other. The connection part 115b is arranged with the contact holes 186f~186m along one side end part of the substrate 102. The contact holes 186a~186m arranged in an interlayer insulation layer are all arranged on an outer side of the opening region 120 at the connection parts 115a, 115b. Since a plurality of wirings 119 is wiring on a lower layer side buried in an interlayer insulation layer, it is possible to miniaturize the wiring 119 compared with the first connection wiring 136 and second connection wiring 142. As a result, it is possible to narrow the width of a wiring region arranged as far as the second terminal region 112b.

The display device 100 related to one embodiment of the present invention is arranged with the first detection electrode pattern 138 and second detection electrode pattern 144 which form the touch sensor 108 above the substrate 102. Since it is not necessary to externally attach a touch sensor arranged as a separate product with this structure, it is possible to achieve a thin display device 100. As is shown in FIG. 2, the first detection electrode 134 and second detection electrode 140 are arranged to be buried in the sealing layer 126 or contacting the sealing layer 126. Since a dielectric layer for forming electrostatic capacitance between the first detection electrode 134 and second detection electrode 140 is replaced with a part of the sealing layer 126 with this structure, it is possible to achieve an even thinner display device 100.

Figure 5:
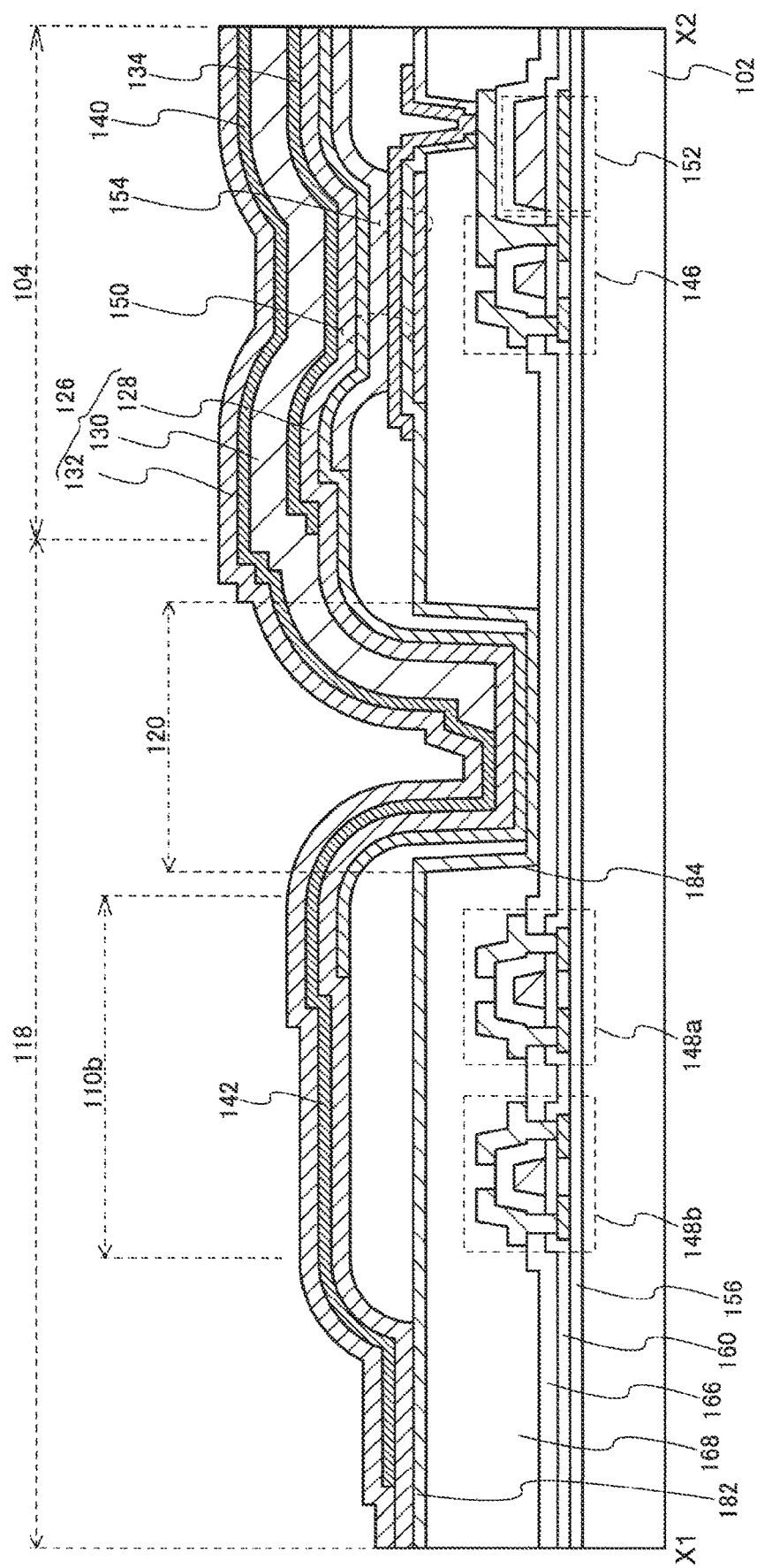
FIG. 5 is a cross-sectional diagram showing a structure of a display device related to one embodiment of the present invention.

FIG. 5 shows a cross-sectional structure of the display device 100 related to one embodiment of the present invention. FIG. 5 schematically shows a cross-sectional structure of the pixel region 104 and a periphery region 118 located on the outer side of the pixel region 104. This cross-sectional structure corresponds to the structure along the line X1-X2 shown in FIG. 3.

As is shown in FIG. 5, the pixel region 104 and periphery region 118 are arranged above the substrate 102. The periphery region 118 includes the opening region 120 and drive circuit 110b. The pixel region 104 includes a transistor 146, organic EL element 150, first capacitor element 152 and second capacitor element 154. Details of these elements are shown in FIG. 6.

Figure 6:
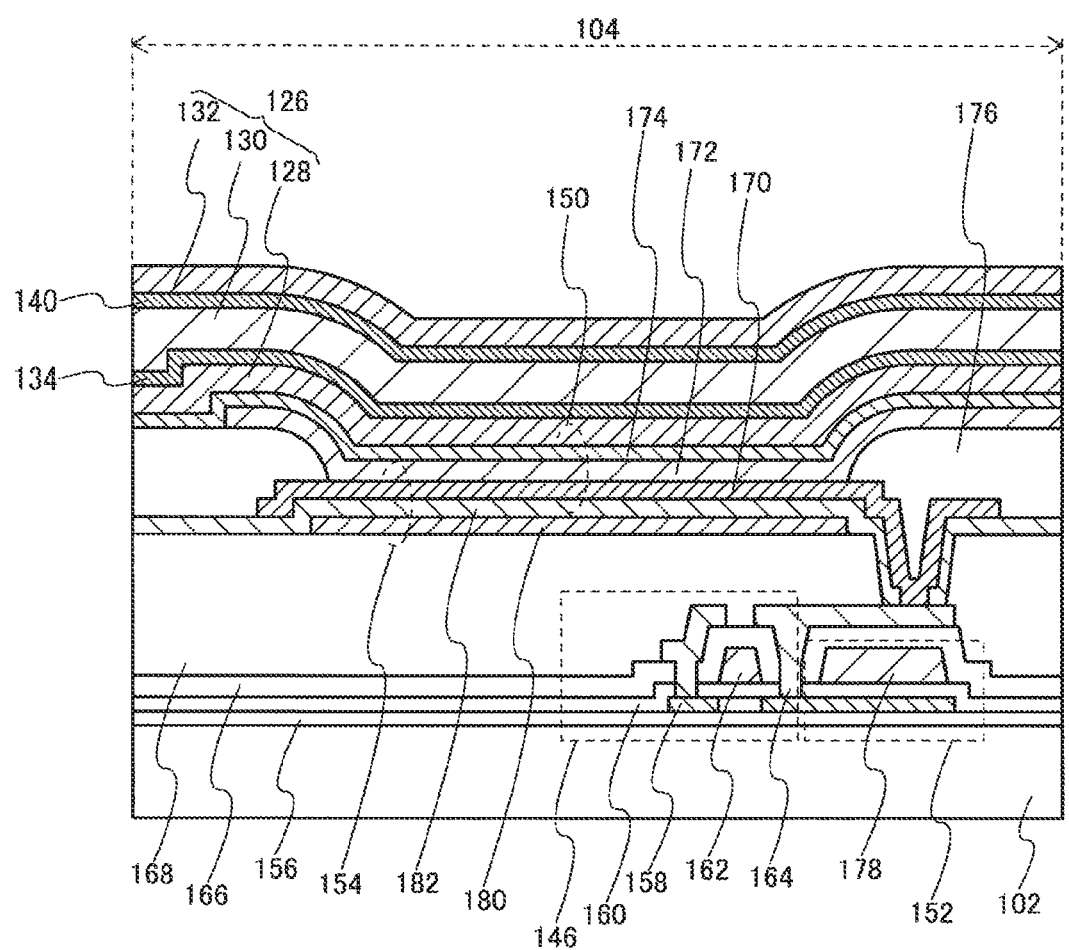
FIG. 6 is a cross-sectional diagram showing a structure of a pixel region of a display device related to one embodiment of the present invention.

As is shown in FIG. 6, the organic EL element 150 is electrically connected with the transistor 146. A current flowing between the source and drain of the transistor 146 is controlled by a video signal applied to the gate and light emitting luminosity of the organic EL element 150 is controlled by this current. The first capacitor element 152 stores a gate voltage of the transistor 146 and the second capacitor element 154 is arranged for adjusting the amount of current flowing to the organic EL element 150. Furthermore, the second capacitor element 154 in not essential and can be omitted.

A base insulation layer 156 is arranged on a first surface of the substrate 102. The transistor 146 is arranged above the base insulation layer 156. The transistor 146 has a structure in which a semiconductor layer 158, gate insulation layer 160 and gate electrode 162 are stacked. The semiconductor layer 158 is formed from amorphous or polycrystalline silicon or an oxide semiconductor material and the like. A source/drain wiring 164 is arranged on an upper layer of the gate electrode 162 via a first insulation layer 166. A second insulation layer 168 is arranged as a leveling layer on an upper layer of the source/drain wiring 164.

The first insulation layer 166 and the second insulation layer 168 are interlayer insulation layers. The first insulation layer 166 is a type of inorganic interlayer insulation layer and is formed from an inorganic insulation material such as silicon oxide, silicon nitride, silicon oxynitride or aluminum oxide and the like. The second insulation layer 168 is a type of organic interlayer insulation layer and is formed from an organic insulation material such as polyimide or acrylic and the like. An interlayer insulation layer is stacked with the first insulation layer 166 and second insulation layer 168 in order from the substrate 102 side. By arranging the second insulation layer 168 formed from an organic insulation material on an upper layer of the first insulation layer 166, concave and convex parts caused by the transistor 146 and the like are buried and the surface is leveled.

The organic EL element 150 is arranged on an upper surface of the second insulation layer 168. The organic EL element 150 has a structure in which a pixel electrode 170 electrically connected with the transistor 146, an organic layer 172 and a counter electrode 174 are stacked. The organic EL element 150 is a two-terminal element and light emission is controlled by controlling a voltage between the pixel electrode 170 and counter electrode 174. A partition wall layer 176 is arranged above the second insulation layer 168 so as to cover a periphery edge part of the pixel electrode 170 and expose an inner side region. The counter electrode 174 is arranged on an upper surface of the organic layer 172. The organic layer 172 is arranged from a region which overlaps the pixel electrode 170 to an upper surface part of the partition wall layer 176. The partition wall layer 176 is formed from an organic resin material in order to both cover a periphery edge part of the pixel electrode 170 and to form a smooth step at an end part of the pixel electrode 170. Acrylic or polyimide and the like is used as the organic resin material.

The organic layer 172 is formed of a single layer or a plurality of layers including an organic EL material. The organic layer 172 is formed using a low molecular or high molecular organic material. In the case where a low molecular organic material is used, the organic layer 172 is formed including a hole injection layer, an electron injection layer, a hole transport layer, an electron transport layer and the like in addition to the light emitting layer containing an organic EL material. For example, the organic layer 172 can have a structure in which a light emitting layer is sandwiched between a hole injection layer and an electron injection layer. In addition to the hole injection layer and the electron injection layer, a hole transport layer, an electron transport layer, a hole block layer and an electron block layer and the like may be appropriately added to the organic layer 172.

Furthermore, in this embodiment the organic EL element 150 has a so-called top emission type structure in which light emitted by the organic layer 172 is radiated toward the counter electrode 174 side. As a result, it is preferred that the pixel electrode 170 has light reflectivity. In addition to the pixel electrode 170 being formed by a light reflective metal material such as aluminum (Al) or silver (Ag), the pixel electrode 170 may have a structure in which a transparent conductive layer formed from ITO (Indium Tin Oxide) or IZO (Indium Zinc Oxide) which have excellent hole injection properties, and a light-reflective metal layer are stacked.

The counter electrode 174 is formed from a transparent conductive film such as ITO or IZO which have translucency and conductivity in order to allow light emitted from the organic layer 172 to pass through. A layer containing an alkali metal such as lithium or an alkaline earth metal such as magnesium may be arranged at the interface between the counter electrode 174 and the organic layer 172 in order to increase carrier injection properties.

The first capacitor element 152 is formed in a region where the semiconductor layer 158 and the first capacitor electrode 178 overlap using the gate insulating layer 160 as a dielectric film. In addition, the second capacitor element 154 is formed by the pixel electrode 170 and a second capacitor electrode 180 overlapping the pixel electrode using a third insulating layer 182 arranged between the pixel electrode 170 and the second capacitor electrode 180 as a dielectric film. The third insulating layer 182 is formed by an inorganic insulation material such as silicon nitride.

The sealing layer 126 is arranged on an upper layer of the organic EL element 150. The sealing layer 126 is arranged to prevent moisture and the like from entering the organic EL element 150. The sealing layer 126 has a structure in which a first inorganic insulation layer 128, an organic insulation layer 130 and a second inorganic insulation layer 132 are stacked from the organic EL element 150 side. The first inorganic insulation layer 128 and the second inorganic insulation layer 132 are formed from an inorganic insulation material such as silicon nitride, silicon nitride oxide and aluminum oxide or the like. The first inorganic insulation layer 128 and the second inorganic insulation layer 132 are formed by depositing these inorganic insulation materials using a sputtering method or a plasma CVD method, or the like. The first inorganic insulation layer 128 and the second inorganic insulation layer 132 are formed to a thickness of 0.1 µm to 10 µm, and preferably 0.5 µm to 5 µm.

Figure 8:
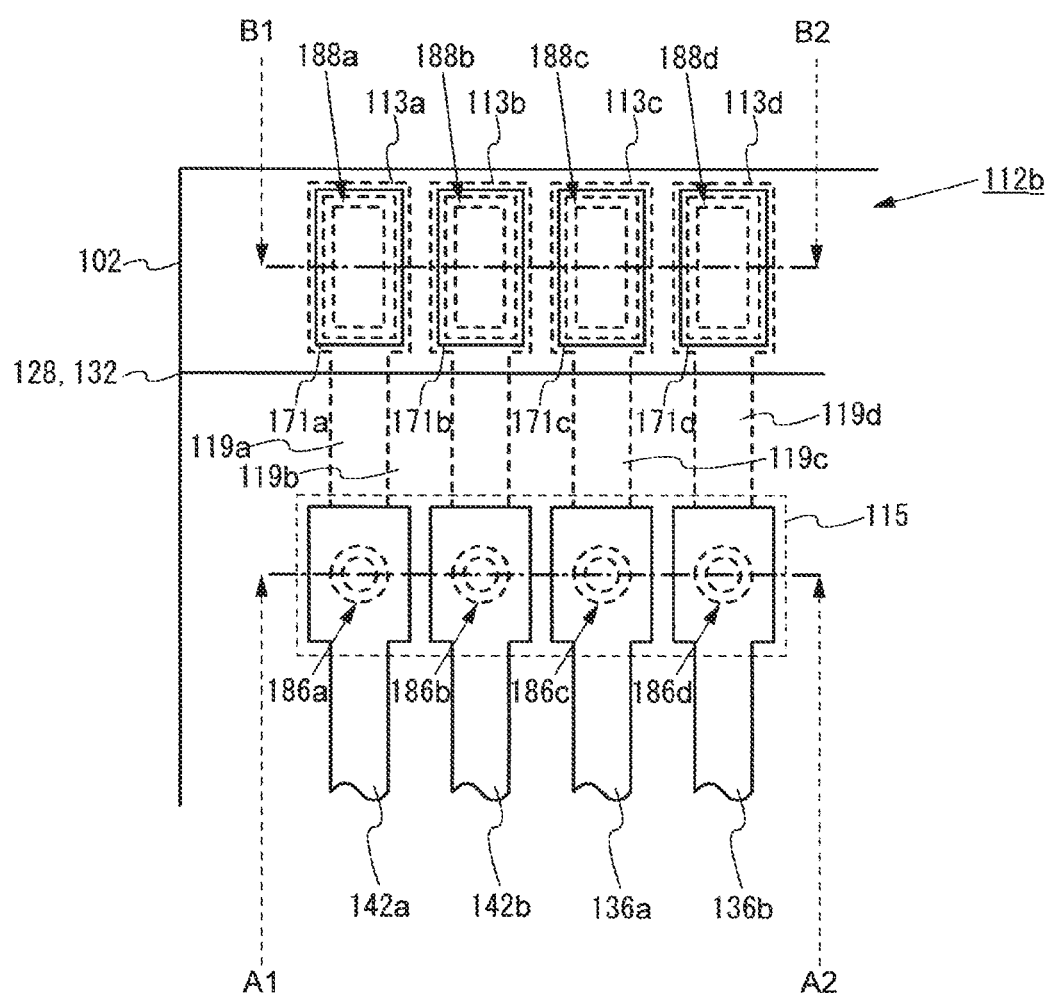
FIG. 8 is a planar diagram showing a structure of a display device related to one embodiment of the present invention.

Furthermore, as is shown in FIG. 8 described herein, the first inorganic insulation layer 128 and the second inorganic insulation layer 132 are preferably formed by depositing on the entire surface of the substrate 102 in order to expose a region of the second terminal region 112b and then patterning by photolithography or ensuring that an insulation film is not formed at least in the second terminal region 112b using a mask (a metal mask having an opening part on the film formation surface).

It is preferred that the organic insulation layer 130 is formed of acrylic resin, polyimide resin, epoxy resin, or the like. The organic insulation layer 130 is arranged with a thickness of 1 µm to 20 µm, and preferably 2 µm to 10 µm. The organic insulation layer 130 is formed by a coating method such as spin coating or an evaporation method using an organic material source. The organic insulation layer 130 is formed in a predetermined region including the pixel region 104 so as to both cover the pixel region 104 and to seal the end part with the first inorganic insulation layer 128 and the second inorganic insulation layer 132. For example, it is preferred that the end part (contour part) of the organic insulation layer 130 is arranged between the pixel region 104 and the opening region 120 or at a position overlapping the opening region 120. As a result, after forming the organic insulation layer 130 on the entire surface of the substrate 102 by a coating method, either the outer periphery region is removed by etching or formed into a predetermined pattern in advance by an evaporation method (mask evaporation) using a mask that opens the deposition target surface, inkjet printing, flexographic printing or gravure printing.

Furthermore, although omitted in FIG. 6, a polarization plate 116 is arranged on the upper surface of the sealing layer 126 as shown in FIG. 1. In addition to a polarizer, the polarization plate 116 may also include a color filter layer and a light shielding layer as appropriate.

The first detection electrode 134 of the touch sensor 108 is arranged between the first inorganic insulation layer 128 and the organic insulation layer 130 and the second detection electrode 140 is arranged between the organic insulation layer 130 and the second inorganic insulation layer 132. The first detection electrode 134 and the second detection electrode 140 are preferably formed from a transparent conductive film in order to allow light emitted from the organic EL element 150 to pass through. Coatings of ITO and IZO which are one type of transparent conductive film are produced by a sputtering method. In addition, the first detection electrode 134 and the second detection electrode 140 may be produced by a printing method using silver nanowires.

In the present embodiment, since the organic insulation layer 130 is formed on an upper layer of the first detection electrode 134, even if foreign objects are adhered after forming the transparent conductive film forming the first detection electrode 134, the foreign objects can be coated with the organic insulation layer 130. In this way, short circuits between the second detection electrode 140 formed on the organic insulation layer 130 and the first detection electrode 134 can be prevented. Furthermore, since the second inorganic insulation layer 132 is arranged on an upper layer of the organic insulation layer 130 (upper layer of the second detection electrode 140), a function as the sealing layer 126 can be maintained.

In FIG. 5, the driving circuit 110b included in the periphery region 118 on the outer side of the pixel region 104 is arranged with transistors 148a and 148b. For example, the transistor 148*a* is an n channel transistor and the transistor 148*b* is a p channel transistor. A drive circuit is formed by such transistors.

The opening region 120 is arranged between the pixel region 104 and the drive circuit 110*b*. The opening region 120 includes an opening part 184 which passes through the second insulation layer 168. The opening part 184 is arranged along at least one side of the pixel region 104. Preferably, the opening part 184 is arranged so as to surround the pixel region 104. The second insulation layer 168 is divided into a pixel region 104 side and a drive circuit 110*b* side by the opening part 184. In addition, the partition wall layer 176 is also divided at the opening part 184. In other words, the second insulation layer 168 and the partition wall layer 176 formed from an organic material are removed in the opening part 184. The third insulation layer 182 and the counter electrode 174 arranged on the upper surface of the partition wall layer 176 are arranged along the side surface and the bottom surface of the opening part 184.

An end part of the organic insulation layer 130 forming the sealing layer 126 is arranged in the opening part 184. The first inorganic insulation layer 128 and the second inorganic insulation layer 132 extend to the outer side of the end part of the organic insulation layer 130. In this way, a structure in which the first inorganic insulation layer 128 and the second inorganic insulation layer 132 are in contact with each other is formed in the outer side region of the organic insulation layer 130. In other words, the organic insulation layer 130 is sandwiched between the first inorganic insulation layer 128 and the second inorganic insulation layer 132, and has a structure in which the end part is not exposed. With this structure, it is possible to prevent moisture or the like from entering from the end part of the organic insulation layer 130. Furthermore, the end part of the organic insulation layer 130 may be located outside the pixel region 104. However, by overlapping the end part with the opening part 184, a region can be arranged in the opening region 120 in which the first insulation layer 166, the third insulation layer 182, the counter electrode 174, the first inorganic insulation layer 128, the second connection wiring 142, and the second inorganic insulation layer 132 are stacked. With such a stacked structure, sealing capabilities can be increased.

In this way, a sealing structure is formed by dividing the second insulation layer 168 and the partition wall layer 176 formed from an organic insulation material in the periphery region 118 by the opening part 184, and by arranging the third insulation layer 182 and the counter electrode 174 formed from an inorganic material so as to cover the side surface and the bottom surface of the opening part 184. The third insulation layer 182 is arranged in close contact with the first insulation layer 166 formed from an inorganic material at the bottom part of the opening part 184. By sandwiching the second insulation layer 168 and the partition wall layer 176 formed from an organic insulating material between inorganic material layers, it is possible to prevent moisture from entering the pixel region 104 from the end part of the substrate 102. A region in which the opening part 184 for separating the second insulation layer 168 and the partition wall layer 176 is arranged can function as a moisture blocking region and its structure can be called a "moisture blocking structure".

The second connection wiring 142 which is connected to the second detection electrode 140 passes through the opening region 120 and is arranged above the drive circuit 110*b*. As is shown in FIG. 3, the second connection wiring 142 extends from the pixel region 104 toward one side edge of the substrate 102 and extends along the one side edge so as to be connected to the second terminal region 112*b*.

An insulation layer is arranged on an extended part where the second connection wiring 142 extends toward the second terminal region 112*b*. A base insulation layer 156, a gate insulating layer 160, a first insulation layer 166, a second insulation layer 168, and a third insulation layer 182 are arranged from the substrate 102 side on a lower layer side of the second connection wiring 142. Although an insulation layer can be omitted such as the base insulation layer 156 among these insulation layers, by arranging at least the second insulation layer 168 as a leveling layer on the lower layer side of the second connection wiring 142, it is insulated from the wiring of the driving circuit 110*b*. The second connection wiring 142 is arranged sandwiched between the first inorganic insulation layer 128 and the second inorganic insulation layer 132 above the second insulation layer 168. In this way, the second connection wiring 142 is protected by the first inorganic insulation layer 128 and the second inorganic insulation layer 132.

Figure 7:
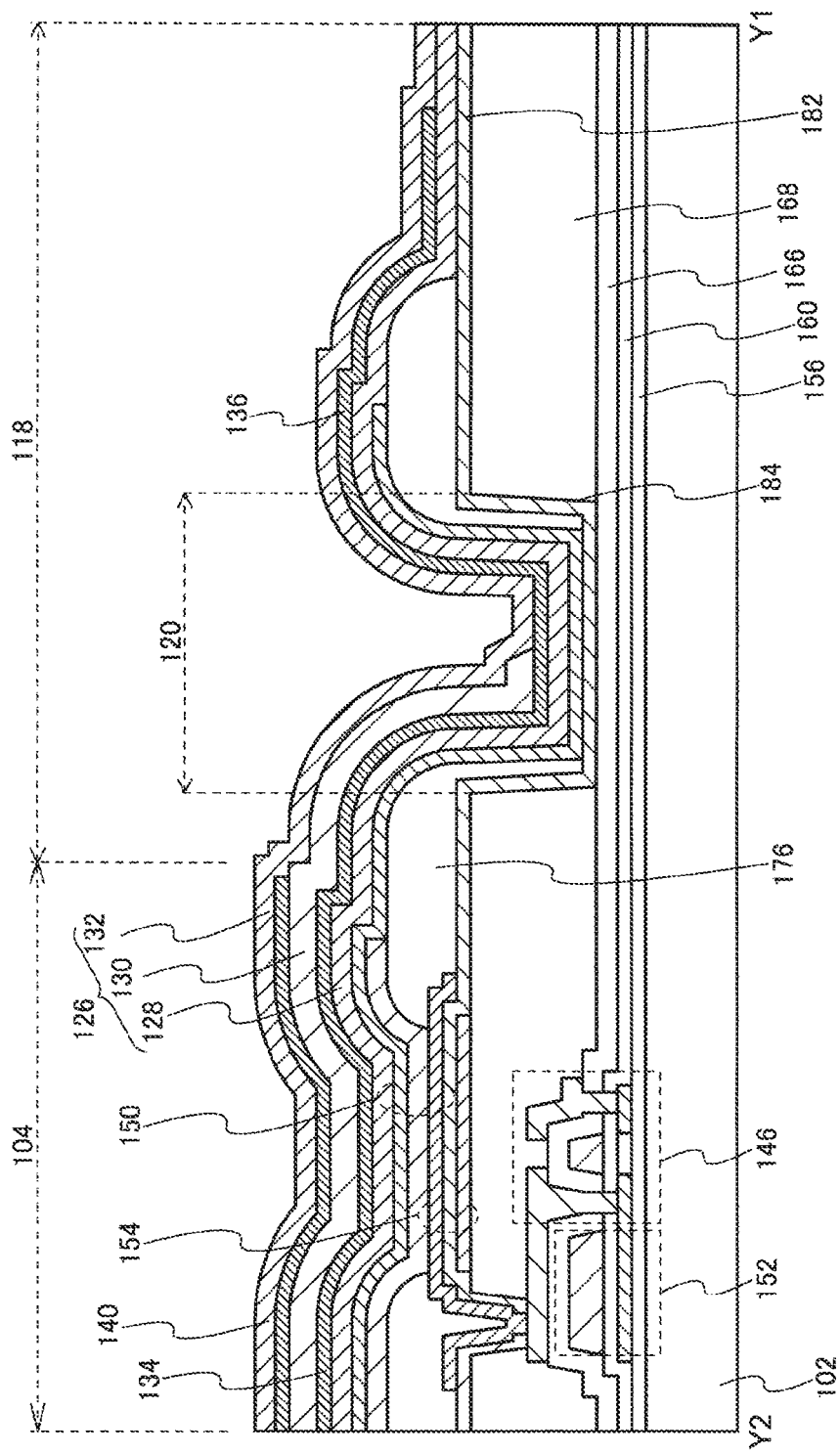
FIG. 7 is a cross-sectional diagram showing a structure of a display device related to one embodiment of the present invention.

FIG. 7 shows a cross-sectional structure corresponding to the line Y1-Y2 shown in FIG. 3. The pixel region 104 and the periphery region 118 are also shown in FIG. 7. The periphery region 118 includes the opening region 120. In the opening region 120, a region is included in the opening part 184 in which the first insulation layer 166, the third insulation layer 182, the counter electrode 174, the first inorganic insulation layer 128, the second detection electrode 140, and the second inorganic insulation layer 132 are stacked. The first connection wiring 136 connected to the first detection electrode 134 is arranged along an upper surface of the first inorganic insulation layer 128 and extends beyond the opening region 120 toward the end part side of the substrate 102.

An insulating layer is arranged on the extended part where the first connection wiring 136 extends toward the second terminal region 112*b*. Similar to the second connection wiring 142, the base insulation layer 156, the gate insulation layer 160, the first insulation layer 166, the second insulation layer 168, and the third insulation layer 182 are arranged on a lower layer side of the first connection wiring 136 from the substrate 102 side. The first connection wiring 136 is arranged sandwiched between the first inorganic insulation layer 128 and the second inorganic insulation layer 132 above the second insulation layer 168. In this way, the first connection wiring 136 is protected by the first inorganic insulation layer 128 and the second inorganic insulation layer 132. The first connection wiring 136 is arranged sandwiched between the first inorganic insulation layer 128 and the second inorganic insulation layer 132. In this way, the first connection wiring 136 is protected by the first inorganic insulation layer 128 and the second inorganic insulation layer 132.

Figure 9A:
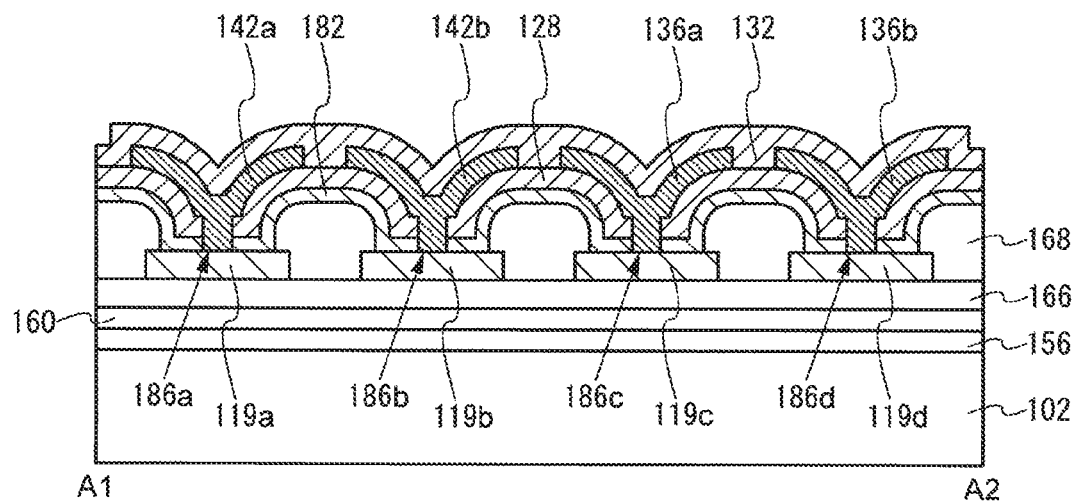
FIG. 9A is a structure of a display device related to one embodiment of the present invention and shows a cross-section of a connection part.
Figure 9B:
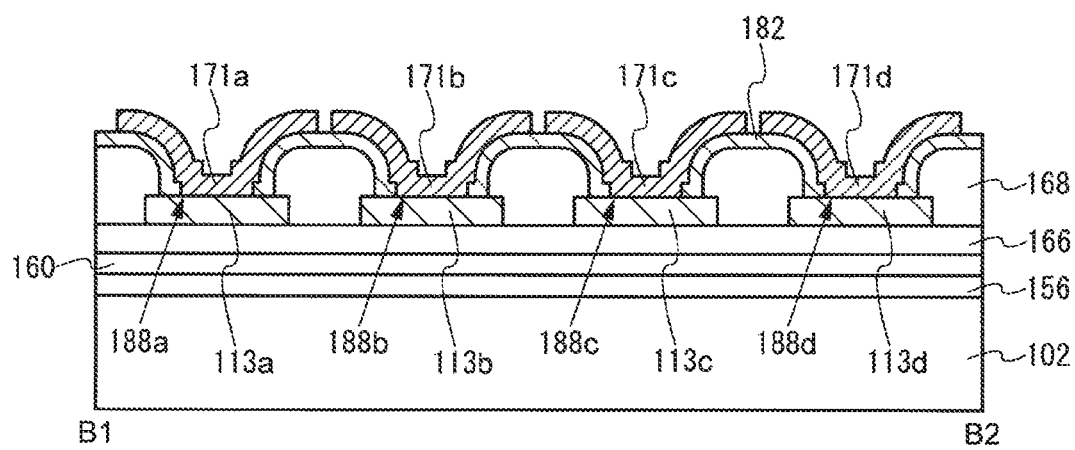
FIG. 9B is a structure of a display device related to one embodiment of the present invention and shows a cross-section of a terminal electrode.

Details of the terminal region 112 and the connection part 115 shown in FIG. 3 are shown in FIG. 8, FIG. 9A, and FIG. 9B. FIG. 8 is a planar view of a terminal electrode 113 and connection part 115, and FIG. 9A shows a cross-sectional structure corresponding to the line A1-A2 in the drawing, and FIG. 9B shows a cross-sectional structure corresponding to the line B1-B2. In the explanation below, an explanation is given while referring to FIG. 8, FIG. 9A, and FIG. 9B as appropriate.

In the second terminal region 112*b*, terminal electrodes 113*a*~113*d* are arranged along an end part of the substrate 102, and wirings 119*a*~119*d* are arranged corresponding to each terminal electrode. The terminal electrodes 113*a*~113*d* are electrically connected to the wirings 119*a*~119*d*. The wirings 119a~119d extend from the terminal electrodes 113a~113d to the connection part 115. Second connection wirings 142a and 142b and first connection wirings 136a and 136b are arranged corresponding to the arrangement of the wirings 119a~119d.

The terminal electrodes 113a~113d are formed by the same conductive layer as the source/drain wiring 164 for example. The terminal electrodes 113a~113d are covered by an upper insulation layer similar to the source/drain wiring 164. For example, the terminal electrodes 113a~113d are covered by the second insulation layer 168 and the third insulation layer 182 as an upper layer insulation layer. The first inorganic insulation layer 128 and the second inorganic insulation layer 132 are arranged so as not to cover the terminal electrodes 113a~113d. That is, the end parts of the first inorganic insulation layer 128 and the second inorganic insulation layer 132 are arranged further to the inner side than the end of the substrate 102. The first inorganic insulation layer 128 and the second inorganic insulation layer 132 are arranged so as not to cover the terminal electrodes 113a~113d. That is, the end parts of the first inorganic insulation layer 128 and the second inorganic insulation layer 132 are arranged further to the inner side than the end part of the substrate 102.

Upper surface parts of the terminal electrodes 113a~113d are exposed by opening parts 188a~188d from which an upper layer insulation layer is removed at the connection part with the flexible printed wiring substrate 114. The opening parts 188a~188d are regions where an opening part arranged in the second insulation layer 168 overlaps with an opening part arranged in the third insulation layer 182. The open end of the opening part of the second insulation layer 168 and the open end of the opening part of the third insulation layer 182 may match with each other or as is shown in FIG. 9B, the open end of the opening part of the third insulation layer 182 may be arranged further to the inner side than the open end of the opening part in the second insulation layer 168. As is shown in FIG. 9B, a side end part of the open part of the second insulation layer 168 formed from an organic insulating material is covered by the third insulation layer 182 formed using an inorganic insulation material, thereby it is possible to prevent moisture or the like from entering from the side end part of the opening part of the second insulation layer 168.

The first inorganic insulation layer 128 and the second inorganic insulation layer 132 include the opening region 120 and are arranged on roughly the entire surface excluding one part of the substrate 102. The end parts of the first inorganic insulation layer 128 and the second inorganic insulation layer 132 are located in a region further to the inner side than the terminal electrodes 113a~113d which is an inner side region which does not reach the end part of the substrate 102 so that the opening parts 188a~188d are not buried in a region of the second terminal region 112b. This also applies to the first terminal region 112a. Oxide conductive films 171a~171d are arranged in parts where the terminal electrodes 113a~113d are exposed by the opening parts 188a~188d. The oxide conductive films 171a~171d are formed, for example, using the same layer as the conductive layer forming the pixel electrode 170. Although the oxide conductive films 171a~171d are not essential, they are preferably arranged in order to protect the surfaces of the terminal electrodes 113a~113d and to prevent an increase in contact resistance due to oxidation.

As is shown in FIG. 9A, the wirings 119a~119d, the first connection wirings 136a and 136b, and the second connection wirings 142a and 142b are respectively connected via contact holes 186a~186d. The contact holes 186a~186d are formed in a region where opening parts formed by a through hole arranged in the second insulation layer 167, a through hole arranged in the third insulation layer 182, and a through hole arranged in the first inorganic insulation layer 128 overlap. A base insulation layer 156, a gate insulation layer 160, and a first insulation layer 166 are stacked on a lower layer of the terminal electrodes 113a~113d. The first connection wirings 136a and 136b and the second connection wirings 142a and 142b are arranged with the first inorganic insulation layer 128 on a lower layer side and the second inorganic insulation layer 132 on an upper layer side in the connection part 115. The first inorganic insulation layer 128 and the second inorganic insulation layer 132 are insulation films which have high barrier properties against moisture such as silicon nitride, silicon oxynitride, and aluminum oxide or the like. The first connection wirings 136a and 136b and the second connection wirings 142a and 142b are insulated in the periphery region 118 by being sandwiched between the first inorganic insulation layer 128 and the second inorganic insulation layer 132 which prevent corrosion due to the influence of moisture or the like. Furthermore, since the contact holes 186a~186d are arranged on the outer side of the opening region 120 as shown in FIG. 3, even if through holes are arranged in the first inorganic insulation layer 128, moisture does not penetrate to the inner side of the sealing layer 126.

In the sealing layer 126, an end part of the organic insulation layer 130 is not arranged further to the outer side than the opening region 120 as shown in FIG. 5 and FIG. 7. That is, an end part of the organic insulation layer 130 is located further to the inner side than an end part of the first inorganic insulation layer 128 and the second inorganic insulation layer 132, and is arranged inside the contact hole 186. In this way, the end part of the organic insulation layer 130 which forms the sealing layer 126 has a structure that is not exposed to the exterior even by the region where the contact hole 186 is formed, so that entry of moisture or the like can be prevented. In this way, the sealing layer 126 can prevent deterioration of sealing capabilities.

As shown in FIG. 9A, the first connection wiring 136 connected to the first detection electrode 134 and the second connection wiring 142 connected to the second detection electrode 140 are extracted to the outer side of the organic insulation layer 130 which forms the sealing layer 126, and connected to the wiring on a lower layer side (for example, wiring formed using the same layer as a source/drain electrode), thereby it is possible to ensure an electrical connection. In other words, the first connection wiring 136 connected to the first detection electrode 134 and the second connection wiring 142 connected to the second detection electrode 140 are sealed by the first inorganic insulation layer 128 and the second inorganic insulation layer 132 outside the opening region 120 up to a region reaching the connection part 115, thereby the reliability of a touch sensor can be improved.

As is shown in FIG. 5 and FIG. 7, by arranging the first detection electrode 134 and second detection electrode 140 via the organic insulation layer 130, short-circuits are prevented even in the case where foreign objects remain. In addition, by arranging the first connection wiring 136 which is connected to the first detection electrode 134 and second connection wiring 142 which is connected to the second detection electrode 140 each sandwiched by the first inorganic insulation layer 128 and second inorganic insulation layer 132, and pulling the wiring in different directions in the substrate 102, both wirings are insulated. By adopting such a structure, short circuits of detection electrodes and wiring which form a touch sensor are securely prevented.

Furthermore, according to the present embodiment, since the first detection electrode 134 and second detection electrode 140 are internally arranged in the sealing layer 126 sandwiching the organic insulation layer 130, it is possible to make a thin display device 100. This type of structure can also be applied to a sheet shaped substrate in which the substrate 102 is formed with an organic resin material and can realize a flexible display installed with a touch panel.

What is claimed is:

1. A display device comprising:
   a substrate having an insulation surface;
   a plurality of wirings above the insulation surface;
   an interlayer insulation layer above the plurality of wirings;
   a light emitting element above the interlayer insulation layer;
   a first inorganic insulation layer covering the light emitting element;
   a pair of detection electrodes above the first inorganic insulation layer;
   a second inorganic insulation layer above the pair of detection electrodes;
   a first connection wiring between the first inorganic insulation layer and the second inorganic insulation layer, the first connection wiring electrically connecting one of the pair of detection electrodes and one of the plurality of wirings; and
   a second connection wiring between the first inorganic insulation layer and the second inorganic insulation layer, the second connection wiring electrically connecting another of the pair of detection electrodes and another of the plurality of wirings, wherein
   the interlayer insulation layer has an opening portion where the interlayer insulation layer is removed,
   the opening portion is between the light emitting element and an edge of the substrate, and
   the first connection wiring and the second connection wiring intersect the opening portion in a planar view.

2. The display device according to claim 1, wherein
   the first connection wiring and the one of the plurality of wirings are electrically connected via a first contact hole,
   the second connection wiring and the another of the plurality of wirings are electrically connected via a second contact hole, and
   the first contact hole and the second contact hole are arranged in line which is parallel to an edge of the substrate.

3. The display device according to claim 2, wherein
   the pair of detection electrodes include a first detection electrode layer and a second detection electrode layer.

4. The display device according to claim 3, wherein
   an organic insulation layer is between the first detection electrode layer and the second detection electrode layer.

5. The display device according to claim 4, wherein
   an end part of the organic insulation layer is arranged further to inner side than an end part of the first inorganic insulation layer and an end part of the second inorganic insulation layer, and is arranged further to the inner side than the first contact hole and the second contact hole above the substrate.

6. The display device according to claim 2, wherein
   the first contact hole and the second contact hole passes through the first inorganic insulation layer, and the second inorganic insulation layer covering the first contact hole and the second contact hole.

7. The display device according to claim 2, wherein
   the opening portion is between the light emitting element and the first contact hole, and
   the opening portion is between the light emitting element and the second contact hole.

* * * * *